US012800410B2

(12) United States Patent
Hsu et al.

(10) Patent No.: US 12,800,410 B2
(45) Date of Patent: Nov. 17, 2026

(54) PRESSURE SENSING FLEXIBLE CIRCUIT BOARD CAPABLE OF VIBRATION IN RESPONSE TO USER TOUCH

(71) Applicants: QingDing Precision Electronics (Huai'an) Co., Ltd., Jiangsu Province (CN); Avary Holding (Shenzhen) Co., Ltd., Shenzhen (CN); Garuda Technology Co., Ltd., New Taipei City (TW)

(72) Inventors: Hsiao-Ting Hsu, Shenzhen (CN); Yung-Yu Hsiao, Shenzhen (CN); Fu-Yun Shen, Shenzhen (CN); Ming-Jaan Ho, Shenzhen (CN)

(73) Assignees: QingDing Precision Electronics (Huai'an) Co., Ltd., Jiangsu Province (CN); Avary Holding (Shenzhen) Co., Ltd., Shenzhen (CN); Garuda Technology Co., Ltd., New Taipei City (TW)

( * ) Notice: Subject to any disclaimer, the term of this patent is extended or adjusted under 35 U.S.C. 154(b) by 370 days.

(21) Appl. No.: 18/392,219

(22) Filed: Dec. 21, 2023

(65) Prior Publication Data

US 2025/0207986 A1 Jun. 26, 2025

(51) Int. Cl.
*G01L 1/16* (2006.01)
*H01H 13/85* (2006.01)
(Continued)

(52) U.S. Cl.
CPC ............... *G01L 1/16* (2013.01); *H01H 13/85* (2013.01); *H05K 1/0298* (2013.01); *H05K 1/036* (2013.01);
(Continued)

(58) Field of Classification Search
CPC ....... G01L 1/16; G06F 1/1637; G06F 1/1643; G06F 1/1684; G06F 2203/014;
(Continued)

(56) References Cited

U.S. PATENT DOCUMENTS

2010/0156818 A1* 6/2010 Burrough ............ G06F 3/04883 345/173
2011/0261021 A1* 10/2011 Modarres ................ G06F 3/016 345/177
(Continued)

FOREIGN PATENT DOCUMENTS

CN 106886333 A * 6/2017 ........... G06F 3/0412
JP H10303475 A * 11/1998 ............. H01L 41/09
(Continued)

*Primary Examiner* — David L Singer
(74) *Attorney, Agent, or Firm* — MUNCY, GEISSLER, OLDS & LOWE, P.C.

(57) ABSTRACT

A pressure sensing flexible circuit board includes a flexible circuit substrate and a pressure sensing element and a vibrating element disposed on the flexible circuit substrate. The pressure sensing element includes a first piezoelectric layer; plural first interlayer electrical conductor dispersed within the first piezoelectric layer; a first polymer layer adjacent to the first piezoelectric layer; and a first electrode layer disposed on the first piezoelectric layer. The vibrating element includes a multi-layer piezoelectric structure; a second electrode layer disposed on the multi-layer piezoelectric structure; and a second polymer layer adjacent to the multi-layer piezoelectric structure. Each layer of the multi-layer piezoelectric structure includes a second piezoelectric layer and plural second interlayer electrical conductor dispersed within the second piezoelectric layer.

10 Claims, 5 Drawing Sheets

(51) Int. Cl.

| | |
|---|---|
| ***H05K 1/02*** | (2006.01) |
| ***H05K 1/03*** | (2006.01) |
| ***H05K 1/189*** | (2026.01) |
| ***H05K 3/325*** | (2026.01) |
| *G06F 3/01* | (2006.01) |

(52) U.S. Cl.
CPC ............. *H05K 1/189* (2013.01); *H05K 3/326* (2013.01); *G06F 3/016* (2013.01); *G06F 2203/04105* (2013.01)

(58) Field of Classification Search
CPC . G06F 2203/04102; G06F 2203/04103; G06F 2203/04105; G06F 2203/04106; G06F 2203/04808; G06F 3/01; G06F 3/016; G06F 3/041; G06F 3/0412; G06F 3/04144; H01H 13/704; H01H 13/85; H01H 13/88; H05K 1/0298; H05K 1/036; H05K 1/189; H05K 3/20; H05K 3/326; H05K 3/423; H05K 3/4611; H05K 3/4614; H05K 3/4626; H05K 3/4641; H10N 30/101
See application file for complete search history.

(56) References Cited

U.S. PATENT DOCUMENTS

| | | | | |
|---|---|---|---|---|
| 2018/0299958 | A1* | 10/2018 | Wang | H10N 30/101 |
| 2020/0045425 | A1 | 2/2020 | Rusconi Clerici Beltrami et al. | |
| 2020/0241678 | A1* | 7/2020 | Yeom | G06F 3/04883 |
| 2022/0327897 | A1* | 10/2022 | Jin | B06B 1/0629 |
| 2023/0195231 | A1 | 6/2023 | Moussette et al. | |
| 2024/0302917 | A1* | 9/2024 | Hua | G06F 3/0446 |

FOREIGN PATENT DOCUMENTS

| | | | | | |
|---|---|---|---|---|---|
| KR | 20220139207 | A | * | 10/2022 | H04L 41/113 |
| TW | 201826552 | A | | 7/2018 | |
| TW | I750044 | B | * | 12/2021 | G06F 3/041 |
| TW | I784685 | B | | 11/2022 | |

* cited by examiner

PRESSURE SENSING FLEXIBLE CIRCUIT BOARD CAPABLE OF VIBRATION IN RESPONSE TO USER TOUCH

BACKGROUND

Field of Disclosure

The present disclosure relates to a pressure sensing flexible circuit board and a method of fabricating the same. More particularly, the present disclosure relates to a pressure sensing flexible circuit board including a pressure sensing element and a vibrating element and a method of fabricating the same.

Description of Related Art

Flexible pressure sensitive touch technology is currently widely used in electronic devices, such as smartphones having touch screens and various buttons, touchpad of laptop, etc. However, compared to mechanical buttons, since the displacement of the flexible pressure sensitive touch technology is smaller, users may not certainly sense whether the buttons are pressed.

SUMMARY

An aspect of the present disclosure provides a pressure sensing flexible circuit board, which integrates a pressure sensing element and a vibrating element on a flexible circuit substrate.

Another aspect of the present disclosure provides a method of fabricating the pressure sensing flexible circuit board.

According to the aspect of the present disclosure, providing the pressure sensing flexible circuit board. The pressure sensing flexible circuit board includes a flexible circuit substrate and a pressure sensing element and a vibrating element disposed on the flexible circuit substrate. The pressure sensing element includes a first piezoelectric layer; plural first interlayer electrical conductors dispersed within the first piezoelectric layer; a first polymer layer adjacent to the first piezoelectric layer; and a first electrode layer disposed on the first piezoelectric layer and connected to the first interlayer electrical conductors. The vibrating element includes a multi-layer piezoelectric structure; a second electrode layer disposed on a topmost layer of the multi-layer piezoelectric structure; and a second polymer layer adjacent to the multi-layer piezoelectric structure. Each layer of the multi-layer piezoelectric structure includes a second piezoelectric layer, and plural second interlayer electrical conductors dispersed within the second piezoelectric layer.

According to an embodiment of the present disclosure, the pressure sensing element further includes a first conductive pole adjacent to the first piezoelectric layer, in which the first conductive pole extends from the first electrode layer into the flexible circuit substrate. The vibrating element further includes at least a second conductive pole adjacent to the multi-layer piezoelectric structure and the second polymer layer, in which the second conductive pole extends from the second electrode layer through the flexible circuit substrate.

According to an embodiment of the present disclosure, the pressure sensing flexible circuit board further includes a first buffer layer disposed between the flexible circuit substrate and the pressure sensing element; and a second buffer layer disposed between the flexible circuit substrate and the vibrating element.

According to an embodiment of the present disclosure, the first interlayer electrical conductors and the second interlayer electrical conductors include Cu/Ni, Cu/Ag/Ni, Cu/Au/Ni or alloy particles of combinations thereof.

According to an embodiment of the present disclosure, each of the first interlayer electrical conductors and the second interlayer electrical conductors has an average size of 4 μm to 20 μm.

According to an embodiment of the present disclosure, each layer of the multi-layer piezoelectric structures further includes a conductive layer disposed on the second piezoelectric layer.

According to another aspect of the present disclosure, a method of fabricating a pressure sensing flexible circuit board is provided. The method includes providing a flexible circuit substrate; forming a first piezoelectric layer and a second piezoelectric layer on the flexible circuit substrate, in which the first piezoelectric layer and the second piezoelectric layer include plural interlayer electrical conductors; forming a first polymer layer on the flexible circuit substrate, in which the first polymer layer separates the first piezoelectric layer and the second piezoelectric layer; forming a metal layer on the first polymer layer, the first piezoelectric layer and the second piezoelectric layer; forming a multi-layer piezoelectric structure on the second piezoelectric layer, in which each layer of the multi-layer piezoelectric structure includes a piezoelectric layer and a conductive layer; and forming a cover plate on the metal layer and the multi-layer piezoelectric structure to form a pressure sensing element and a vibrating element, in which the pressure sensing element includes the first piezoelectric layer, and the vibrating element includes the second piezoelectric layer and the multi-layer piezoelectric structure.

According to an embodiment of the present disclosure, the method further includes patterning the metal layer before forming the multi-layer piezoelectric structure to form a first electrode layer and a conductive metal layer, in which the first electrode layer is located on the first piezoelectric layer, and the conductive metal layer is located between the second piezoelectric layer and the multi-layer piezoelectric structure.

According to an embodiment of the present disclosure, before forming the cover plate, the method further includes forming a first conductive pole adjacent to the first piezoelectric layer, in which the first conductive pole extends from the metal layer into the flexible circuit substrate; and forming at least a second conductive pole adjacent to the second piezoelectric layer and the multi-layer piezoelectric structure, in which the second conductive pole extends from a topmost portion of the multi-layer piezoelectric structure into the flexible circuit substrate.

According to an embodiment of the present disclosure, forming the multi-layer piezoelectric structure includes forming a second polymer layer adjacent to the piezoelectric layer of each of the multi-layer piezoelectric structure.

According to an embodiment of the present disclosure, forming the first piezoelectric layer and a second piezoelectric layer further includes forming insulating layers on the first piezoelectric layer and the second piezoelectric layer, respectively.

According to an embodiment of the present disclosure, the first piezoelectric layer, the second piezoelectric layer and the piezoelectric layer are formed from ceramic material.

According to the aspect of the present disclosure, providing the pressure sensing flexible circuit board. The pressure sensing flexible circuit board includes a flexible circuit substrate and a pressure sensing element and a vibrating element disposed on the flexible circuit substrate. The pressure sensing element includes a first piezoelectric layer; a first electrode layer disposed on the first piezoelectric layer; and a first conductive pole adjacent to the first piezoelectric layer, in which the first conductive pole extends from the first electrode layer into the flexible circuit substrate. The vibrating element includes a multi-layer piezoelectric structure; a second electrode layer disposed on top of the multi-layer piezoelectric structure; and at least a second conductive pole adjacent to the multi-layer piezoelectric structure, in which the at least a second conductive pole extends from the second electrode layer through the flexible circuit substrate. The multi-layer piezoelectric structure includes plural second piezoelectric layer; and plural conductive layers disposed on each of the second piezoelectric layer, respectively.

According to an embodiment of the present disclosure, the pressure sensing element further includes a first polymer layer adjacent to the first piezoelectric layer; and the vibrating element further includes a second polymer layer adjacent to the multi-layer piezoelectric structure.

According to an embodiment of the present disclosure, the pressure sensing element further includes plural first interlayer electrical conductors dispersed within the first piezoelectric layer; and the multi-layer piezoelectric structure of the vibrating element further includes plural second interlayer electrical conductors dispersed within the second piezoelectric layers.

According to an embodiment of the present disclosure, the first interlayer electrical conductors and the second interlayer electrical conductors include Cu/Ni, Cu/Ag/Ni, Cu/Au/Ni or alloy particles of combinations thereof.

According to an embodiment of the present disclosure, each of the first interlayer electrical conductors and the second interlayer electrical conductors has an average size of 4 μm to 20 μm.

According to an embodiment of the present disclosure, the first piezoelectric layer and the second piezoelectric layers include ceramic material and metal.

According to an embodiment of the present disclosure, a thickness of each of the first piezoelectric layer and the second piezoelectric layers is in a range of 50 μm to 150 μm.

According to an embodiment of the present disclosure, the pressure sensing flexible circuit board further includes a first cover plate disposed over the first electrode layer; and a second cover plate, disposed over the second electrode layer.

Application of the pressure sensing flexible circuit board and the method of fabricating the same to integrate the pressure sensing element and the vibrating element on the flexible circuit substrate, thereby saving space, and using the vibrating element including the multi-layer piezoelectric structure to achieve effect of energy saving.

It is to be understood that both the foregoing general description and the following detailed description are by examples, and are intended to provide further explanation of the disclosure as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
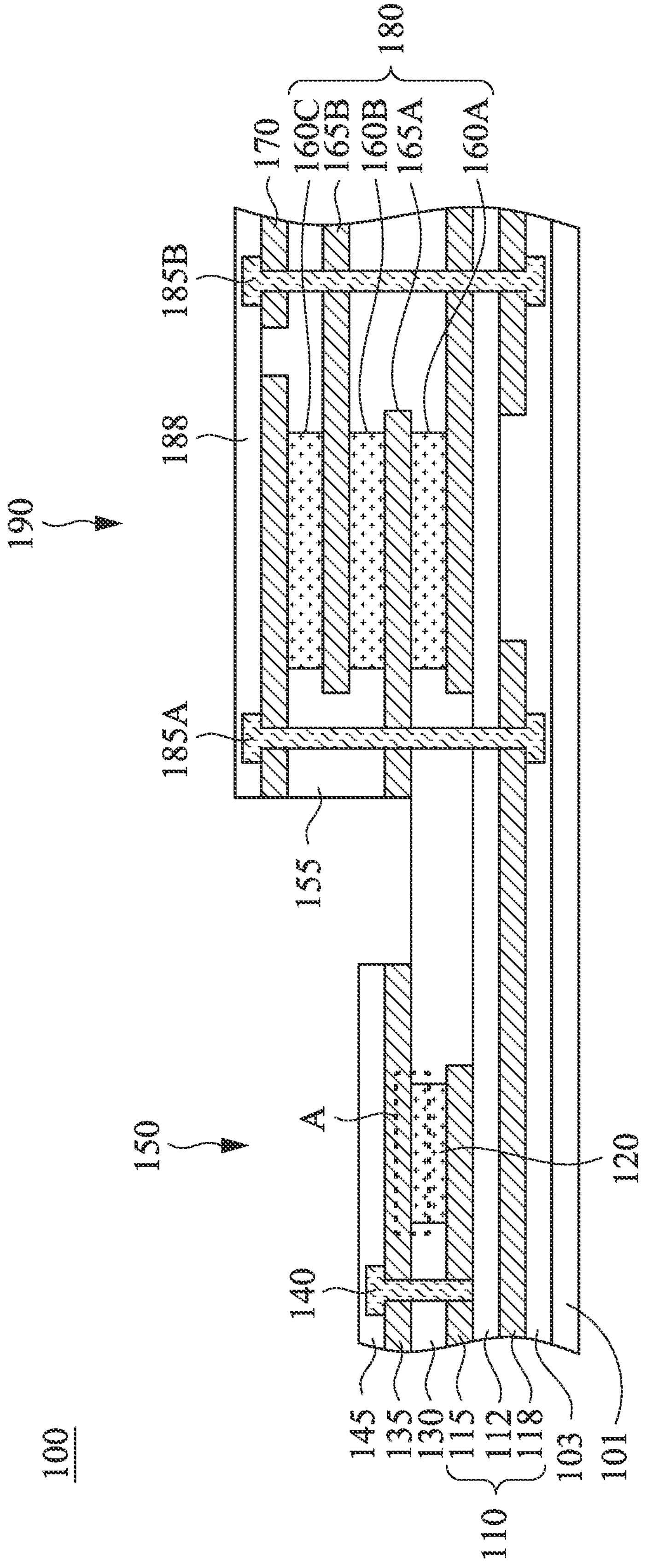
FIG. 1 illustrates a cross-sectional diagram of the pressure sensing flexible circuit board according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, “around,” “about,” “approximately,” or “substantially” shall generally mean within 20 percent, or within 10 percent, or within 5 percent of a given value or range.

According to above, the present disclosure provides a pressure sensing flexible circuit board and a method of fabricating the same, which integrates a pressure sensing element and a vibrating element on a flexible circuit substrate, thereby saving space. The vibrating element including a multi-layer piezoelectric structure is used, such that it shows greater displacement under the same voltage, thereby achieving effect of energy saving. Metal particles are used as interlayer electrical conductors to have greater contact area and greater bonding force, thereby increasing vibration resistance of whole module.

Referring to FIG. 1, FIG. 1 illustrates a cross-sectional diagram of a pressure sensing flexible circuit board 100 according to some embodiments of the present disclosure. The pressure sensing flexible circuit board 100 includes a flexible circuit substrate 110, a pressure sensing element 150 and a vibrating element 190. The pressure sensing element 150 and the vibrating element 190 are both disposed on the flexible circuit substrate 110. In some embodiments, the flexible circuit substrate 110 includes a flexible substrate 112 and an upper circuit layer 115 and a lower circuit layer 118 disposed on an upper surface and a lower surface of the flexible substrate 112, respectively.

In some embodiments, the pressure sensing flexible circuit board 100 further includes a steel sheet 101 and a substrate layer 103, and the flexible circuit substrate 110 is disposed on the steel sheet 101 and the substrate layer 103. In some embodiments, the pressure sensing flexible circuit board 100 further includes a first buffer layer and a second buffer layer (not shown), in which the first buffer layer is disposed between the flexible circuit substrate 110 and the pressure sensing element 150, while the second buffer layer is disposed between the flexible circuit substrate 110 and the vibrating element 190.

The pressure sensing element 150 includes a first piezoelectric layer 120, a first polymer layer 130 and a first electrode layer 135. The first piezoelectric layer 120 is disposed on the upper circuit layer 115 of the flexible circuit substrate 110, and the first polymer layer 130 is also disposed on the upper circuit layer 115 and adjacent to the first piezoelectric layer 120. The first electrode layer 135 is disposed on the first piezoelectric layer 120 and the first polymer layer 130. Disposition of the first polymer layer 130 can make the pressure sensing flexible circuit board 100 have greater stress resistance and vibration resistance. Generally, there's no circuit designed on the first electrode layer 135.

In some embodiments, the first piezoelectric layer 120 includes ceramic material, such as $Pb_2Ti_xO_y$ (x is in a range of 1 to 3, and y is in a range of 1 to 3). In such embodiments, a thickness of the first piezoelectric layer 120 is in a range of about 50 μm to about 150 μm. In some embodiments, the first piezoelectric layer 120 further includes metal such as silver and/or nickel, which may be plated on the ceramic material, and a thickness of plating layer is not greater than 100 nm, thereby decreasing electrical resistance between the first piezoelectric layer 120 and the first electrode layer 135.

Figure 2B:
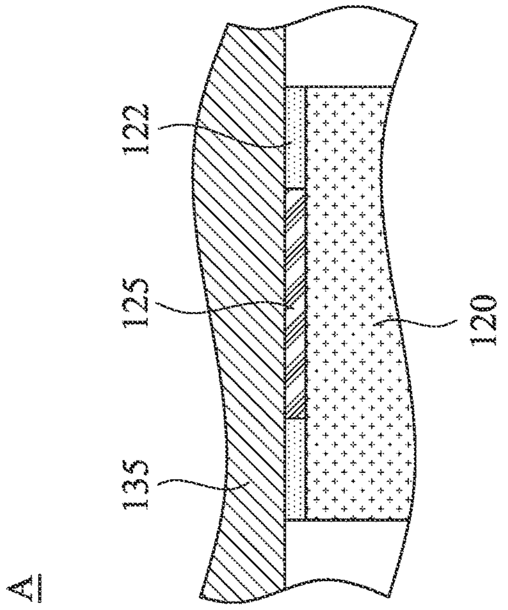
FIG. 2B illustrates a magnified cross-sectional diagram of block A in FIG. 1.
Figure 2A:
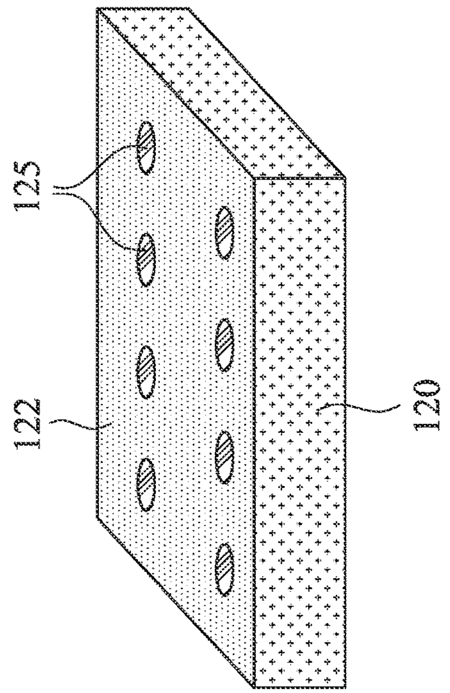
FIG. 2A illustrates a side view of the first piezoelectric layer according to some embodiments of the present disclosure.

Referring to FIGS. 2A and 2B, FIG. 2A illustrates a side view of the first piezoelectric layer 120, and FIG. 2B illustrates a magnified cross-sectional diagram of block A in FIG. 1. As shown in FIG. 2A, the pressure sensing element 150 further includes first interlayer electrical conductors 125 dispersed within the first piezoelectric layer 120 and an insulating layer 122 disposed on the first piezoelectric layer 120. In some embodiments, the insulating layer 122 includes epoxy resin, and the epoxy resin with low coefficient of thermal expansion (CTE) is preferable. The insulating layer 122 can be selected from materials that can be easily adhered to the ceramic material, thereby forming a stable structure of the first piezoelectric layer 120 and the first electrode layer 135, which can withstand pressure, vibration or stress during the application.

As shown in FIG. 2B, the first interlayer electrical conductors 125 conductively connected the first piezoelectric layer 120 and the first electrode layer 135, and the insulating layer 122 is located between the first piezoelectric layer 120 and the first electrode layer 135. In some embodiments, a thickness of the insulating layer 122 is in a range of about 1.5 μm to about 8 μm. In some embodiments, the first interlayer electrical conductors 125 include Cu/Ni, Cu/Ag/Ni, Cu/Au/Ni or alloy particles of combinations thereof. In some embodiments, the first interlayer electrical conductors 125 have an average size of about 4 μm to about 20 μm. Since the first interlayer electrical conductors 125 is formed by pressing metal particles, they can have greater contact area and better bonding force, which helps increase vibration resistance of the element.

The first electrode layer 135 is mainly used for sensing and collecting pressing or contacting signal; thus, the first electrode layer 135 is usually disposed at or near a center of a button of the touch element, such that the first electrode layer 135 can maximize charge collection. In some embodiments, the first electrode layer 135 can be a comb-shaped electrode, which has a line width of about 50 μm to about 500 μm and has a line spacing of about 50 μm to about 300 μm. The first electrode layer 135 has to be grounded to provide a charge loop, thereby ensuring proper electrical signal transmission and electrostatic dissipation.

In some embodiments, the pressure sensing element 150 further includes a first conductive pole 140. The first conductive pole 140 is adjacent to the first piezoelectric layer 120, but not in physically contact with the first piezoelectric layer 120. The first conductive pole 140 extends downwardly from an upper surface of the first electrode layer 135 to the upper circuit layer 115 of the flexible circuit substrate 110, but not extends through the flexible substrate 112. In some embodiments, the pressure sensing element 150 further includes a first cover plate 145 located on over the first electrode layer 135 and the first conductive pole 140.

The vibrating element 190 includes a multi-layer piezoelectric structure 180, a second electrode layer 170, a first polymer layer 130 and a second polymer layer 155. The multi-layer piezoelectric structure 180 is disposed on the upper circuit layer 115 of the flexible circuit substrate 110. The second electrode layer 170 is disposed on the multi-layer piezoelectric structure 180. Generally, there's no circuit designed on the second electrode layer 170. The first polymer layer 130 and the second polymer layer 155 are adjacent to the multi-layer piezoelectric structure 180. Disposition of the second polymer layer 155 can protect the multi-layer piezoelectric structure 180, and the vibrating element 190 of the pressure sensing flexible circuit board 100 can have greater stress resistance and vibration resistance.

The multi-layer piezoelectric structure 180 includes plural second piezoelectric layers and plural conductive layers. As shown in FIG. 1, the multi-layer piezoelectric structure 180 includes the second piezoelectric layer 160A, the second piezoelectric layer 160B, the second piezoelectric layer 160C, the conductive layer 165A and the conductive layer 165B, in which the second piezoelectric layer 160A is located on the upper circuit layer 115, the conductive layer 165A is located on the second piezoelectric layer 160A, the second piezoelectric layer 160B is located on the conductive layer 165B, the conductive layer 165B is located on the second piezoelectric layer 160B, and the second piezoelectric layer 160C is located on the conductive layer 165B. The second electrode layer 170 is disposed on the second piezoelectric layer 160A of the multi-layer piezoelectric structure 180 and the second polymer layer 155. In some embodiments, an area over the multi-layer piezoelectric structure 180 covered by the second electrode layer 170 is more than 85% of an area of the second piezoelectric layer 160C, thereby achieving greater piezoelectric effect.

In some embodiments, the second piezoelectric layers (such as the second piezoelectric layer 160A, the second piezoelectric layer 160B and the second piezoelectric layer 160C) include the ceramic material, such as $Pb_2Ti_xO_y$ (x is in a range of 1 to 3, and y is in a range of 1 to 3). In such embodiments, thickness of the second piezoelectric layers (such as the second piezoelectric layer 160A, the second piezoelectric layer 160B and the second piezoelectric layer 160C) are in a range of about 50 μm to about 150 μm. In some embodiments, the second piezoelectric layers (such as the second piezoelectric layer 160A, the second piezoelectric layer 160B or the second piezoelectric layer 160C) further include metal such as silver and/or nickel, which may be plated on the ceramic material, and a thickness of the plating layer is not greater than 100 nm, thereby decreasing electrical resistance between the multi-layer piezoelectric structure 180 and the second electrode layer 170.

Similar to the first piezoelectric layer 120, the second piezoelectric layers (such as the second piezoelectric layer 160A, the second piezoelectric layer 160B and the second piezoelectric layer 160C) include second interlayer electrical conductors (not shown) dispersed within the second piezoelectric layers and insulating layers (not shown) disposed on the second piezoelectric layers. In some embodiments, the insulating layers include epoxy resin, in which the epoxy resin with low coefficient of thermal expansion (CTE) is preferable, to match the multi-layer piezoelectric structure 180. In some embodiments, thicknesses of the insulating layers are in a range of about 1.5 μm to about 8 μm. The insulating layers can be effectively adhered to the ceramic material, thereby forming a stable structure of the second piezoelectric layers (such as the second piezoelectric layer 160A, the second piezoelectric layer 160B and the second piezoelectric layer 160C) and the second electrode layer 170, which enable the multi-layer piezoelectric structure 180 withstand pressure, vibration or stress during the application.

Similar to the first piezoelectric layer 120, the second interlayer electrical conductors of the second piezoelectric layer 160A conductively connected the second piezoelectric layer 160A and the conductive layer 165A; the second interlayer electrical conductors of the second piezoelectric layer 160B conductively connected the second piezoelectric layer 160B and the conductive layer 165B; the second interlayer electrical conductors of the second piezoelectric layer 160C conductively connected the second piezoelectric layer 160C and the second electrode layer 170. In some embodiments, the second interlayer electrical conductors include Cu/Ni, Cu/Ag/Ni, Cu/Au/Ni or alloy particles of combinations thereof. In some embodiments, the second interlayer electrical conductors have an average size of about 4 μm to about 20 μm. Since the second interlayer electrical conductors are formed by pressing metal particles, they can have greater contact area and better bonding force, which helps increase vibration resistance of the element.

The vibrating element 190 can be a multi-layer parallel structure or co-level parallel structure, which can be designed according to application requirements, and the multi-layer parallel structure is preferable. In some embodiments, the multi-layer piezoelectric structure 180 is a structure with greater than 3 layers, thereby increasing value of output voltage. In some embodiments, an electric field can be applied at two sides of the second electrode layer 170, thereby generating stronger piezoelectric effect. The multi-layer piezoelectric structure 180 of the vibrating element 190 can have greater displacement under the same voltage, thereby achieving effect of energy saving.

In some embodiments, the vibrating element 190 further includes a second conductive pole 185A and a second conductive pole 185B. The second conductive pole 185A and the second conductive pole 185B are adjacent to the second piezoelectric layers 160A-160C of the multi-layer piezoelectric structure 180. The second conductive pole 185A and the second conductive pole 185B extend from top of the second electrode layer 170 through the lower circuit layer 118 of the flexible circuit substrate 110 into the substrate layer 103. In some embodiments, the vibrating element 190 further includes a second cover plate 188 disposed on the multi-layer piezoelectric structure 180.

FIGS. 3A-3D illustrate cross-sectional views of intermediate stages in fabricating the pressure sensing flexible circuit board 100 according to some embodiments of the present disclosure. The fabricating process of the pressure sensing flexible circuit board 100 are described in the following by using FIGS. 3A-3D.

Figure 3A:
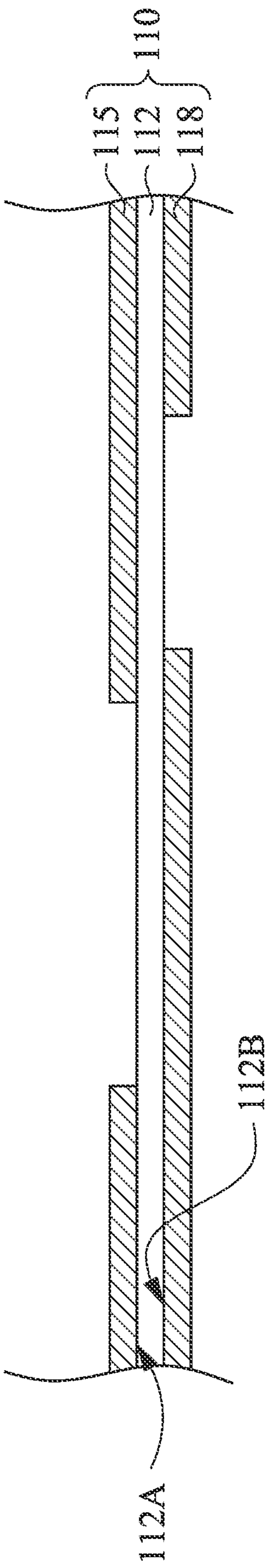
FIGS. 3A-3D illustrate cross-sectional views of intermediate stages in fabricating the pressure sensing flexible circuit board according to some embodiments of the present disclosure.

First, referring to FIG. 3A, the flexible circuit substrate 110 is provided. The flexible circuit substrate 110 includes the flexible substrate 112, the upper circuit layer 115 and the lower circuit layer 118, in which the upper circuit layer 115 is disposed on an upper surface 112A of the flexible substrate 112, while the lower circuit layer 118 is disposed on a lower surface 112B of the flexible substrate 112.

Subsequently, referring to FIG. 3B, the first piezoelectric layer 120 and the second piezoelectric layer 160A are formed on the upper circuit layer 115 of the flexible circuit substrate. The first piezoelectric layer 120 further includes the first interlayer electrical conductors 125 dispersed within the first piezoelectric layer 120 and the insulating layer 122 disposed on the first piezoelectric layer 120 (see FIGS. 2A and 2B). Similarly, the second piezoelectric layer 160A further includes the second interlayer electrical conductors dispersed within the second piezoelectric layer 160A and the insulating layer disposed on the second piezoelectric layer 160A.

Figure 3B:
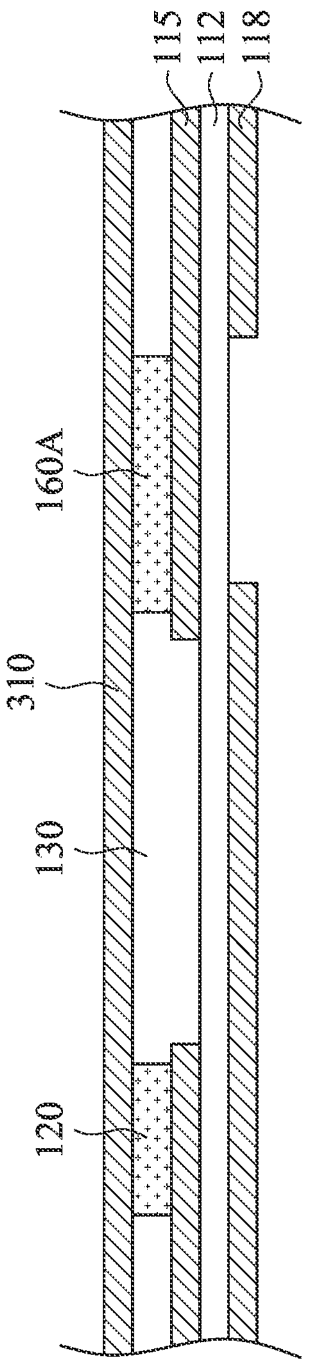

Continuing with FIG. 3B, the first polymer layer 130 is formed on the flexible circuit substrate 110, and the first polymer layer 130 separates the first piezoelectric layer 120 and the second piezoelectric layer 160A. Then, a metal layer 310 is formed on the first polymer layer 130, the first piezoelectric layer 120 and the second piezoelectric layer 160A.

Figure 3C:
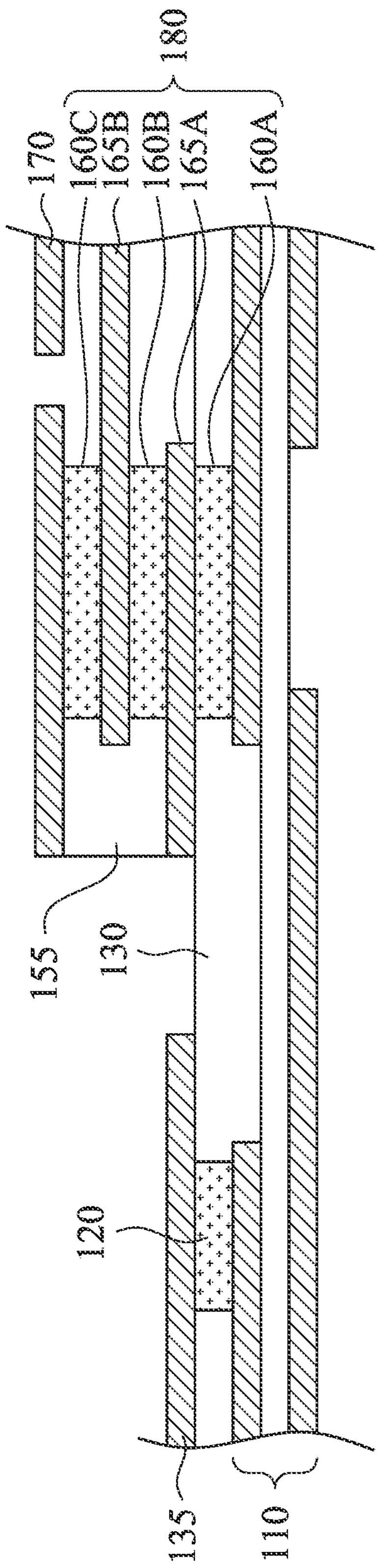

Referring to FIG. 3C, the metal layer 310 is patterned to from the first electrode layer 135 on the first piezoelectric layer 120 and the conductive layer 165A on the second piezoelectric layer 160A. Subsequently, the second piezoelectric layer 160B, the conductive layer 165B, the second piezoelectric layer 160C and the second electrode layer 170 are pressed on the conductive layer 165A in order, thereby completing the multi-layer piezoelectric structure 180. It is understood that, similar to the second piezoelectric layer 160A, the second piezoelectric layer 160B and the second piezoelectric layer 160C further include the second interlayer electrical conductors and the insulating layers. Moreover, during the process of the multi-layer piezoelectric structure 180, the second polymer layer 155 is formed adjacent to the multi-layer piezoelectric structure 180.

Figure 3D:
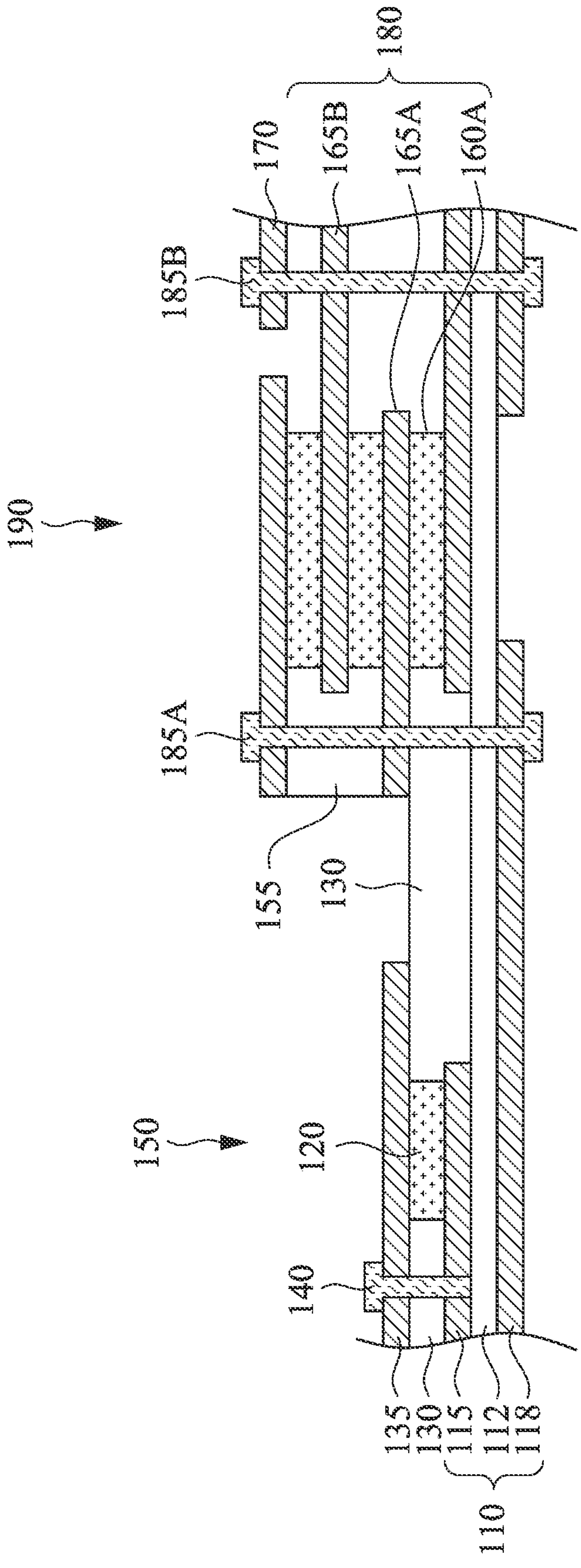

Referring to FIG. 3D, a drilling and copper plating processes are performed to form the first conductive pole 140, the second conductive pole 185A and the second conductive pole 185B. The first conductive pole 140 is disposed adjacent to the first piezoelectric layer 120, and the first conductive pole 140 extends from the upper surface of the first electrode layer 135 through the first polymer layer 130 into the upper circuit layer 115 of the flexible circuit substrate 110, but not extends through the flexible substrate 112. The second conductive pole 185A and the second conductive pole 185B are disposed adjacent to the second piezoelectric layers 160A-160C of the multi-layer piezoelectric structure 180, respectively, and located at two sides of the second piezoelectric layers 160A-160C, respectively.

The second conductive pole 185A and the second conductive pole 185B extend from top of the second electrode layer 170 through the second polymer layer 155, the first polymer layer 130 and the lower circuit layer 118 of the flexible circuit substrate 110. Thus, the pressure sensing element 150 and the vibrating element 190 of the pressure sensing flexible circuit board 100 are almost completed.

Then, the first cover plate 145 is disposed over the first electrode layer 135 of the pressure sensing element 150, and the second cover plate 188 is disposed over the second electrode layer 170 of the vibrating element 190. Such structure is disposed on the steel sheet 101 and the substrate layer 103, and the pressure sensing flexible circuit board 100 as shown in FIG. 1 can be obtained.

The present disclosure provides the pressure sensing flexible circuit board and the method of fabricating the same, which integrates the pressure sensing element and the vibrating element on the flexible circuit substrate, in which the vibrating element is disposed as including the multi-layer piezoelectric structure, such that it shows greater displacement under the same voltage. Moreover, the metal particles are used as interlayer electrical conductors between the piezoelectric layer and the electrode or conductive layer. Therefore, the effect of saving space, saving energy and increasing vibration resistance can be achieved.

The following embodiments are provided to better elucidate the practice of the present disclosure and should not be interpreted in anyway as to limit the scope of same. Those skilled in the art will recognize that various modifications may be made while not departing from the spirit and scope of the disclosure. Therefore, the spirit and scope of the appended claims should not be limited to the description of the embodiments contained herein.

What is claimed is:

1. A pressure sensing flexible circuit board, comprising:

a flexible circuit substrate;

a pressure sensing element, disposed on the flexible circuit substrate, wherein the pressure sensing element comprises:

a first piezoelectric layer;

a plurality of first interlayer electrical conductors, dispersed within the first piezoelectric layer;

a first polymer layer, adjacent to the first piezoelectric layer; and a first electrode layer, disposed on the first piezoelectric layer and connected to the first interlayer electrical conductors;

a vibrating element, disposed on the flexible circuit substrate, wherein the vibrating element comprises:

a multi-layer piezoelectric structure, wherein each layer of the multi-layer piezoelectric structure comprises:

a second piezoelectric layer; and a plurality of second interlayer electrical conductors, dispersed within the second piezoelectric layer;

a second electrode layer, disposed on a topmost layer of the multi-layer piezoelectric structure; and a second polymer layer, adjacent to the multi-layer piezoelectric structure.

2. The pressure sensing flexible circuit board of claim 1, wherein the pressure sensing element further comprises:

a first conductive pole, adjacent to the first piezoelectric layer, wherein the first conductive pole extends from the first electrode layer into the flexible circuit substrate, wherein the vibrating element further comprises:

at least a second conductive pole, adjacent to the multi-layer piezoelectric structure and the second polymer layer, wherein the at least a second conductive pole extends from the second electrode layer through the flexible circuit substrate.

3. The pressure sensing flexible circuit board of claim 1, wherein the first interlayer electrical conductors and the second interlayer electrical conductors comprise Cu/Ni, Cu/Ag/Ni, Cu/Au/Ni or alloy particles of combinations thereof.

4. The pressure sensing flexible circuit board of claim 1, wherein each of the first interlayer electrical conductors and the second interlayer electrical conductors has an average size of 4 μm to 20 μm.

5. The pressure sensing flexible circuit board of claim 1, wherein each layer of the multi-layer piezoelectric structure further comprises:

a conductive layer, disposed on the second piezoelectric layer.

6. A method of fabricating the pressure sensing flexible circuit board of claim 1, comprising:

providing a flexible circuit substrate;

forming a first piezoelectric layer and a second piezoelectric layer on the flexible circuit substrate, wherein the first piezoelectric layer and the second piezoelectric layer comprise a plurality of interlayer electrical conductors;

forming a first polymer layer on the flexible circuit substrate, wherein the first polymer layer separates the first piezoelectric layer and the second piezoelectric layer;

forming a metal layer on the first polymer layer, the first piezoelectric layer and the second piezoelectric layer;

forming a multi-layer piezoelectric structure on the second piezoelectric layer, wherein each layer of the multi-layer piezoelectric structure comprises a piezoelectric layer and a conductive layer, wherein forming the multi-layer piezoelectric structure comprises forming a second polymer layer adjacent to the piezoelectric layer of each of the multi-layer piezoelectric structure; and forming a cover plate on the metal layer and the multi-layer piezoelectric structure to form a pressure sensing element and a vibrating element, wherein the pressure sensing element comprises the first piezoelectric layer, and the vibrating element comprises the second piezoelectric layer and the multi-layer piezoelectric structure.

7. The method of claim 6, further comprising:

patterning the metal layer before forming the multi-layer piezoelectric structure to form a first electrode layer and a conductive metal layer, wherein the first electrode layer is located on the first piezoelectric layer, and the conductive metal layer is located between the second piezoelectric layer and the multi-layer piezoelectric structure.

8. The method of claim 6, before forming the cover plate, further comprising:

forming a first conductive pole adjacent to the first piezoelectric layer, wherein the first conductive pole extends from the metal layer into the flexible circuit substrate; and forming at least a second conductive pole adjacent to the second piezoelectric layer and the multi-layer piezoelectric structure, wherein the at least a second conductive pole extends from a topmost portion of the multi-layer piezoelectric structure into the flexible circuit substrate.

9. The method of claim 6, wherein forming the first piezoelectric layer and a second piezoelectric layer further comprises:

forming insulating layers on the first piezoelectric layer and the second piezoelectric layer, respectively.

10. The method of claim 6, wherein the first piezoelectric layer, the second piezoelectric layer and the piezoelectric layer are formed from ceramic material.

* * * * *